United States Patent
Yun (10) Patent No.: US 7,436,719 B2
(45) Date of Patent: Oct. 14, 2008

(54) AUTO-PRECHARGE SIGNAL GENERATING CIRCUIT

(75) Inventor: Sun Hyuck Yun, Pohang-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 11/647,915

(22) Filed: Dec. 29, 2006

(65) Prior Publication Data

US 2008/0002494 A1 Jan. 3, 2008

(30) Foreign Application Priority Data

Jun. 29, 2006 (KR) ...................... 10-2006-0059887

(51) Int. Cl.
*G11C 7/00* (2006.01)
(52) U.S. Cl. ...................... 365/201; 365/203
(58) Field of Classification Search ................. 365/201, 365/230.03, 189.04
See application file for complete search history.

(56) References Cited

U.S. PATENT DOCUMENTS

| | | | |
|---|---|---|---|
| 6,359,832 B2 * | 3/2002 | Dietrich et al. .......... | 365/233.1 |
| 6,442,644 B1 | 8/2002 | Gustavson et al. | |
| 6,771,558 B2 * | 8/2004 | Kim ....................... | 365/233.18 |
| 7,057,951 B2 * | 6/2006 | Im et al. ..................... | 365/203 |
| 2005/0162959 A1 * | 7/2005 | Lee .............................. | 365/222 |

FOREIGN PATENT DOCUMENTS

| | | |
|---|---|---|
| JP | 11-306760 | 11/1999 |
| KR | 10-1998-0040799 | 8/1998 |
| KR | 10-2000-0008778 | 2/2000 |
| KR | 10-2004-0033474 | 4/2004 |
| KR | 10-2004-0055169 | 6/2004 |

* cited by examiner

*Primary Examiner*—Anh Phung
(74) *Attorney, Agent, or Firm*—John P. White; Cooper & Dunham LLP (57) ABSTRACT

An auto-precharge signal generating circuit is provided which includes a first input signal generator for generating a first input signal in response to a first bank enable signal, which is enabled in accordance with a read or write command for a first bank, and an auto-precharge flag signal, which is enabled for auto-precharging of the first bank, a second input signal generator configured to receive an enable control signal, which is enabled after completion of the read or write operation for the first bank, a plurality of second bank enable signals, which are enabled in response to read commands for a plurality of second banks, respectively, and a test mode signal, which is enabled for a read with auto-precharge (RDA) operation or a write with auto-precharge (WRA) operation in the first and second banks, and generate a second input signal based on the received signals, and an auto-precharge signal output stage configured to receive a buffered signal obtained after buffering of the first input signal, together with the second input signal, generate an auto-precharge signal for auto-precharge of the first bank, and output the auto-precharge signal. The second input signal is enabled when the enable control signal is enabled under the condition in which the test mode signal is enabled.

22 Claims, 4 Drawing Sheets

Prior Art

FIG. 1a

Prior Art

AUTO-PRECHARGE SIGNAL GENERATING CIRCUIT

TECHNICAL FIELD

The present disclosure relates to an auto-precharge signal generating circuit, and, more particularly, to an auto-precharge signal generating circuit which is capable of removing a glitch generated in a test mode, in which an auto-precharge operation is carried out for all banks after a read or write operation (hereinafter, the auto-precharge operation will be referred to as a "read with auto-precharge (RDA) or write with auto-precharge (WRA) operation"), thereby preventing an erroneous auto-precharge operation.

DESCRIPTION OF THE RELATED ART

Generally, when an RDA command or WRA command is input to a bank, no further command is input to the bank, so as to enable the bank to perform a precharge operation. In this case, the bank is internally precharged until a next command is input.

Figure 1A:
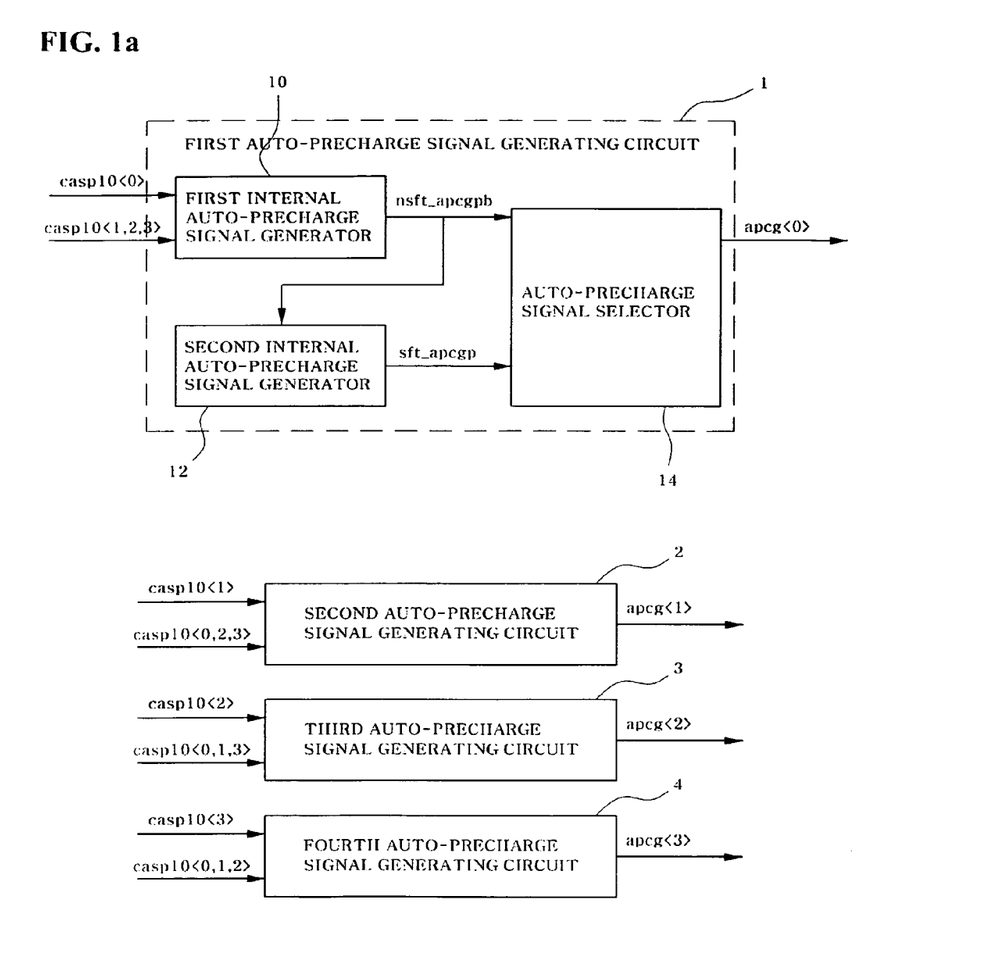
FIG. 1A is a block diagram illustrating a conventional auto-precharge signal generating circuit.

FIG. 1A is a block diagram illustrating a conventional auto-precharge signal generating circuit.

Referring to FIG. 1A, when an RDA or WRA command is input to a memory cell having a 4-bank structure (respective banks will be referred to as first to fourth banks Bank<0:3>), first to fourth bank enable signals casp10<0:3> are input to first to fourth auto-precharge signal generating circuits 5 to 8 included in the first to fourth banks Bank<0:3>, respectively. In response to first to fourth bank enable signals casp10<0:3>, the first to fourth auto-precharge signal generating circuits 5 to 8 generate first to fourth auto-precharge signals apcg<0:3> for precharging banks, respectively. Here, each of the first to fourth bank enable signals casp10<0:3> is a signal enabled in response to a read or write command, and the bracketed Arabic numeral represented in association with each bank enable signal designates the identification number of the associated bank for which a read or write operation is to be executed. For example, the second bank enable signal casp10<1> is enabled when a read or write command for the second bank is input.

In more detail, for example, the first auto-precharge signal generating circuit 5, which generates, the auto-precharge signal apcg<0> for the first bank Bank<0>, includes a first internal auto-precharge signal generator 50 for receiving the first bank enable signal casp10<0>, thereby generating a first internal auto-precharge signal nsft_apcgpb, which is enabled in response to an RDA command, and a second internal auto-precharge signal generator 52 for receiving the first internal auto-precharge signal nsft_apcgpb, and delaying the received first internal auto-precharge signal nsft_apcgpb for a predetermined time, thereby generating a second internal auto-precharge signal sft_apcgpb, which is enabled in response to a WRA command. The first auto-precharge signal generating circuit 5 also includes an auto-precharge signal selector 54 for selecting one of the first internal auto-precharge signal nsft_apcgpb and second internal auto-precharge signal sft_apcgpb in accordance with an operation (read or write) carried out in the first bank Bank<0>, and outputting the selected signal as the first auto-precharge signal apcg<0>. In this case, the first internal auto-precharge signal generator 50 not only receives the first bank enable signal casp10<0>, but also receives the second to fourth bank enable signals casp10<1:3>.

Meanwhile, an RDA or WRA operation is carried out for all banks in a test mode. In the test mode, the first to fourth bank enable signals casp10<0:3> are enabled when a test mode signal tpara (not shown) is enabled.

Figure 1B:
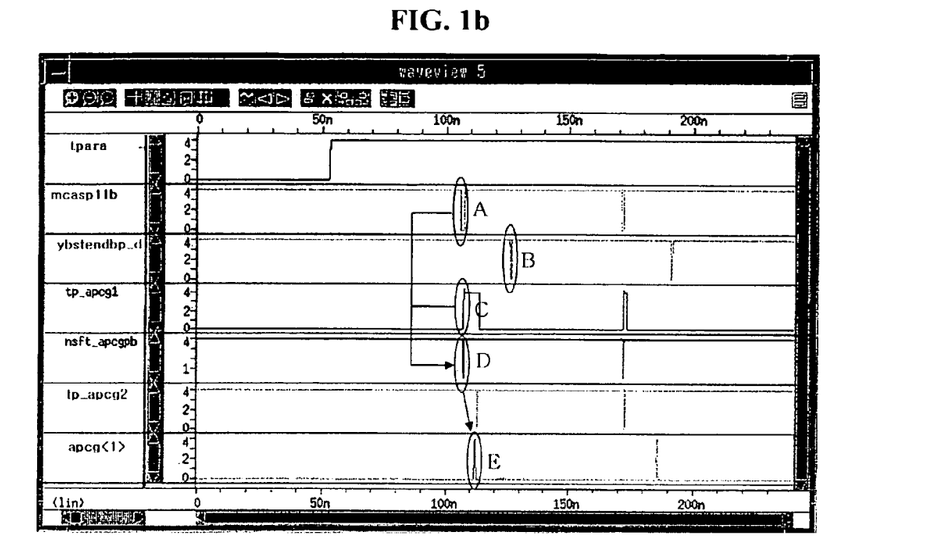
FIG. 1B is a timing diagram illustrating internal signal operations of the conventional auto-precharge signal generating circuit shown in FIG. 1A.

However, when the test mode is executed under the condition in which a first internal signal tp_apcg1 is enabled earlier because an internal voltage Vperi supplied to the first internal auto-precharge signal generator 50 is higher than a reference voltage, the point of time when a glitch is generated in a second internal signal mcasp11b due to the enabled second to fourth enable signals casp10<1:3>, namely, a time point A, and the point of time when the first internal signal tp_apcg1 is enabled, namely, a time point C, are overlapped with each other, as shown in FIG. 1B. As a result, the first internal auto-precharge signal nsft_apcgpb and first auto-precharge signal apcg<0> are enabled (D and E) before a third internal signal ybstendbp9_d is enabled (B). Here, the third internal signal ybstendbp9_d is enabled when burst of data input or output in accordance with a read or write operation is completed. For this reason, when the first auto-precharge signal apcg<0> is enabled earlier than the third internal signal ybstendbp9_d, as mentioned above, there may be a problem in association with an RDA or WRA operation in that an auto-precharge operation is carried out under the condition in which a read or write operation has not been carried out for an insufficient time.

There is a need for an auto-precharge signal generating circuit which is capable of removing a glitch generated in a test mode, in which an auto-precharge operation is carried out for all banks, using a test mode signal, to cause the auto-precharge operation to be carried out after completion of a read or write operation, thereby preventing an erroneous auto-precharge operation.

BRIEF SUMMARY

In accordance with one aspect, the present disclosure provides an auto-precharge signal generating circuit comprising a first input signal generator for generating a first input signal in response to a first bank enable signal, which is enabled in accordance with a read or write command for a first bank, and an auto-precharge flag signal, which is enabled for auto-precharging of the first bank, a second input signal generator configured to receive an enable control signal, which is enabled after completion of the read or write operation for the first bank, a plurality of second bank enable signals, which are enabled in response to read commands for a plurality of second banks, respectively, and a test mode signal, which is enabled for a read with auto-precharge (RDA) operation or a write with auto-precharge (WRA) operation in the first and second banks, and generate a second input signal based on the received signals, and an auto-precharge signal output stage configured to receive a buffered signal obtained after buffering of the first input signal, together with the second input signal, generate an auto-precharge signal for auto-precharge of the first bank, and output the auto-precharge signal. The second input signal is enabled when the enable control signal is enabled under the condition in which the test mode signal is enabled.

The first input signal generator may include first and second input terminals connected between the first node and a ground voltage terminal, to output the first input signal to the first node in response to the first bank enable signal and the auto-precharge flag signal. The first terminal may be connected between the first node and a second node, to transmit a signal at the second node to the first node in response to the first bank enable signal. The second terminal may be connected to the second node and the ground voltage terminal, to pull down the second node in response to the auto-precharge flag signal.

The second input signal generator may comprise a first logic device configured to receive the plurality of second bank enable signals, and perform a logical operation of the received second bank enable signals, a logic unit configured to receive an output signal from the first logic device and the test mode signal, and perform a logical operation of the received signals, and a second logic device for receiving an output signal from the logic unit and the enable control signal, and performing a logical operation for the received signal, to generate the second input signal. The first logic device may perform a NOR operation of the second bank enable signals. The logic unit may perform a NOR operation of the output signal from the first logic device and the test mode signal. The second logic device may perform a NAND operation of the output signal from the logic unit and the enable control signal.

The auto-precharge signal output stage may perform a NAND operation of the buffered signal and the second input signal.

The auto-precharge signal generating circuit may further comprise a latching unit for latching the first input signal, and a delaying unit for delaying an output signal from the latching unit for a predetermined period. The latching unit and the delaying unit may be connected between the first input signal generator and the auto-precharge signal output stage.

The auto-precharge signal generating circuit may further comprise an initializing device connected between a supply voltage terminal and the first node, to initialize a potential of the first node in response to a power-up signal.

The auto-precharge signal generating circuit may further comprise an initialization signal generator configured to receive an initialization control signal, enabled in response to enabling of the auto-precharge signal, and generate an initialization signal, and an initializing device connected between a supply voltage terminal and the first node, to initialize a potential of the first node in response to the initialization signal.

In accordance with another aspect, the present disclosure provides an auto-precharge signal generating circuit comprising a first input signal generator for generating a first input signal in response to a first bank enable signal, which is enabled in accordance with a read or write command for a first bank, and an auto-precharge flag signal, which is enabled for auto-precharging of the first bank, a second input signal generator configured to receive an enable control signal, which is enabled after completion of the read or write operation for the first bank, a plurality of second bank enable signals, which are enabled in response to read commands for a plurality of second banks, respectively, and a test mode signal, which is enabled for a read with auto-precharge (RDA) operation or a write with auto-precharge (WRA) operation in the first and second banks, and generate a second input signal based on the received signals, an auto-precharge signal output stage configured to receive a buffered signal obtained after buffering of the first input signal, together with the second input signal, generate a first internal auto-precharge signal for auto-precharge of the first bank, and output the auto-precharge signal, and an internal auto-precharge signal generator for delaying the first internal auto-precharge signal for a predetermined period, and generating a second internal auto-precharge signal adapted to auto-precharge the first bank after the write operation for the first bank. The second input signal is enabled when the enable control signal is enabled under the condition in which the test mode signal is enabled.

The first input signal generator may include first and second terminals connected between the first node and a ground voltage terminal, to output the first input signal to the first node in response to the first bank enable signal and the auto-precharge flag signal. The first terminal may be connected between the first node and a second node, to transmit a signal at the second node to the first node in response to the first bank enable signal. The second terminal may be connected to the second node and the ground voltage terminal, to pull down the second node in response to the auto-precharge flag signal.

The second input signal generator may comprise a first logic device configured to receive the plurality of second bank enable signals, and perform a logical operation of the received second bank enable signals, a logic unit configured to receive an output signal from the first logic device and the test mode signal, and perform a logical operation of the received signals, and a second logic device configured to receive an output signal from the logic unit and the enable control signal, and perform a logical operation of the received signal, to generate the second input signal. The first logic device may perform a NOR operation of the second bank enable signals. The logic unit may perform a NOR operation of the output signal from the first logic device and the test mode signal. The second logic device may perform a NAND operation of the output signal from the logic unit and the enable control signal.

The auto-precharge signal output stage may perform a NAND operation of the buffered signal and the second input signal. The auto-precharge signal generating circuit may further comprise a latching unit for latching the first input signal, and a delaying unit for delaying an output signal from the latching unit for a predetermined period. The latching unit and the delaying unit may be connected between the first input signal generator and the auto-precharge signal output stage.

The auto-precharge signal generating circuit may further comprise an initializing device connected between a supply voltage terminal and the first node, to initialize a potential of the first node in response to a power-up signal.

The auto-precharge signal generating circuit may further comprise an initialization signal generator configured to receive an initialization control signal, which is enabled in response to enabling of the auto-precharge signal, and generate an initialization signal, and an initializing device connected between a supply voltage terminal and the first node, to initialize a potential of the first node in response to the initialization signal.

BRIEF DESCRIPTION OF THE DRAWINGS

The above-mentioned and other features and advantages of the subject matter of the present disclosure will become more apparent after reading the following detailed description when taken in conjunction with the drawings, in which.

DESCRIPTION OF THE PREFERRED EMBODIMENTS

Hereinafter, the subject matter of the present disclosure will be described in detail, in conjunction with exemplary embodiments. These embodiments are used only for illustrative purposes, and the present disclosure is not limited thereto.

Figure 2A:
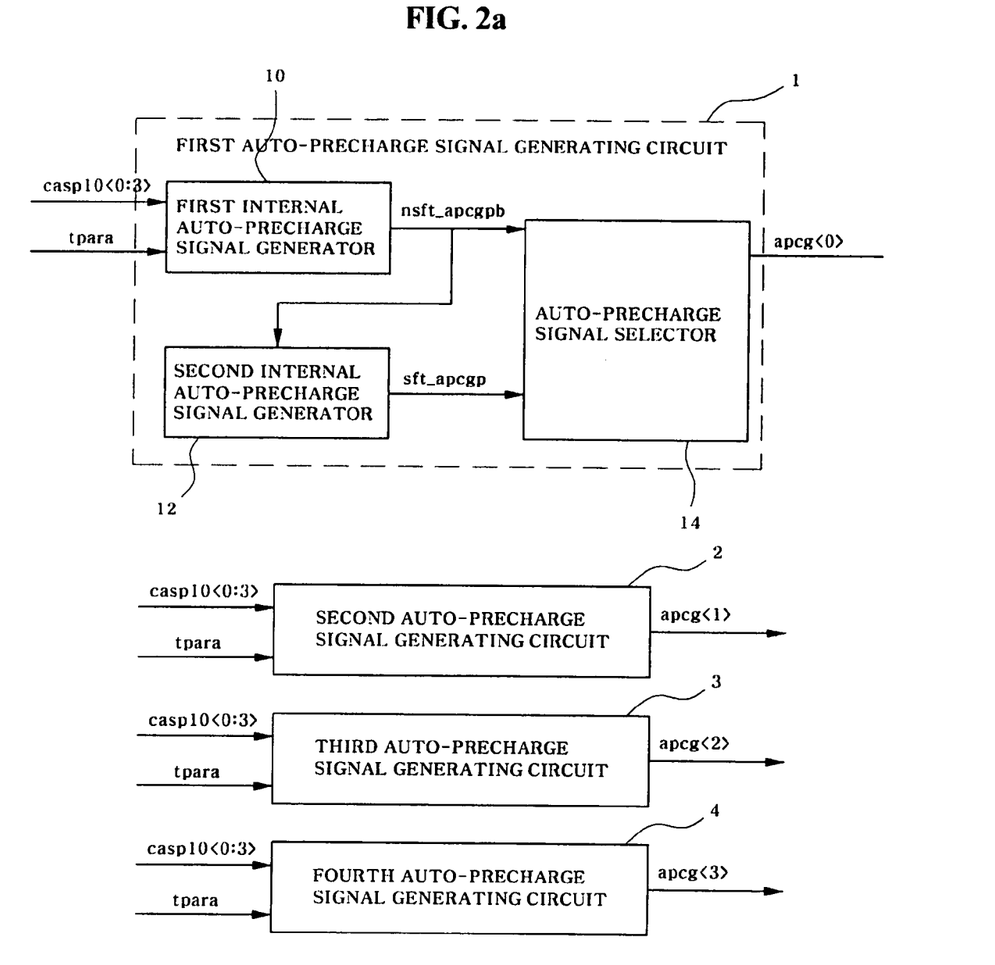
FIG. 2A is a block diagram illustrating an auto-precharge signal generating circuit according to an exemplary embodiment of the present disclosure.

FIG. 2A is a block diagram illustrating an auto-precharge signal generating circuit according to an exemplary embodiment of the present disclosure.

Referring to FIG. 2A, four auto-precharge signal generating circuits, namely, first to fourth auto-precharge signal generating circuits 1 to 4, are illustrated. In accordance with the illustrated preferred embodiment of the present disclosure, the first auto-precharge signal generating circuit 1 includes a first internal auto-precharge signal generator 10 for receiving first to fourth bank enable signals casp10<0:3> and a test mode signal tpara, thereby generating a first internal auto-precharge signal nsft_apcgpb adapted to auto-precharge a first bank Bank<0> after a read operation for the first bank Bank<0>, and a second internal auto-precharge signal generator 12 for delaying the first internal auto-precharge signal nsft_apcgpb for a predetermined time, thereby generating a second internal auto-precharge signal sft_apcgpb adapted to auto-precharge the first bank Bank<0> after a write operation for the first bank Bank<0>. The first auto-precharge signal generating circuit 1 also includes an auto-precharge signal selector 14 for determining whether a read operation or a write operation has been carried out in the first bank Bank<0>, selecting one of the first internal auto-precharge signal nsft_apcgpb and second internal auto-precharge signal sft_apcgpb in accordance with the result of the determination, and outputting the selected signal as an auto-precharge signal apcg<0> adapted to auto-precharge the first bank Bank<0>. Although not shown in detail, the second to fourth auto-precharge signal generating circuits 2 to 4 have the same configuration as the first auto-precharge signal generating circuit 1. The second to fourth auto-precharge signal generating circuits 2 to 4 generate auto-precharge signals apcg<1:3> for auto-precharging the second to fourth banks Bank<1:3>, respectively.

Figure 2B:
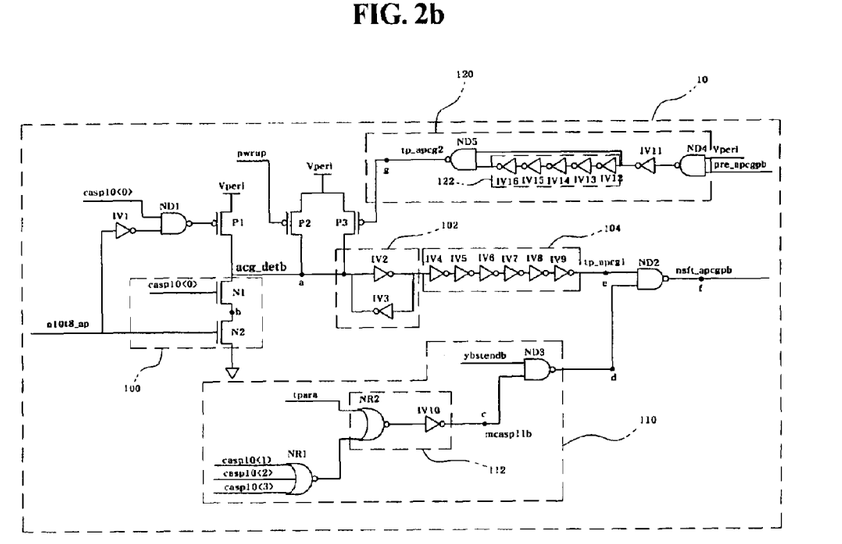
FIG. 2B is a circuit diagram illustrating a detailed circuit configuration of a first internal auto-precharge signal generator included in the circuit of FIG. 2A.

Referring to FIG. 2B, the first internal auto-precharge signal generator 10 includes a first input signal generator 100 for generating a first input signal acg_detb in response to the first bank enable signal casp10<0>, which is enabled in accordance with a read or write command for the first bank Bank<0>, and an auto-precharge flag signal a10t8_ap, which is enabled for auto-precharging of the first bank Bank<0>. The first internal auto-precharge signal generator 10 also includes a second input signal generator 110 for receiving an enable control signal ybstendb, which is enabled after the read or write operation for the first bank Bank<0>, a plurality of additional bank enable signals, namely, second to fourth bank enable signals casp10<1:3>, which are enabled in response to read commands for a plurality of additional banks, namely, second to fourth Bank<1:3>, respectively, and the test mode signal tpara, which is enabled for a read with auto-precharge (RDA) or write with auto-precharge (WRA) operation in the first to fourth banks Bank<0:3>, generating a second input signal based on the received signals, and outputting the second input signal to a node d. The first internal auto-precharge signal generator 10 further includes a NAND gate ND2 for receiving a first input signal obtained after buffering of the enable control signal ybstendb, together with the second input signal from the node d, generating the first internal auto-precharge signal nsft_apcgpb for auto-precharging of the first bank Bank<0>, based on the received signals, and outputting the generated first internal auto-precharge signal nsft_apcgpb to a node f. In this case, the second input signal, which is output to the node d in an enable state of the test mode signal tpara, is enabled only when the enable control signal ybstendb is enabled.

The first input signal generator 100 includes an NMOS transistor N1 which is connected between a node a and a node b, and is turned on in response to the first bank enable signal casp<0>, and an NMOS transistor N2 which is connected between the node b and a terminal coupled to a ground voltage Vss, and is turned on in response to the auto-precharge flag signal a10t8_ap, to output the first input signal acg_detb to the node a. The second input signal generator 110 includes a NOR gate NR1 which receives the second to fourth bank enable signals casp10<1:3>, and performs a NORing operation for the received signals. The second input signal generator 110 also includes a logic unit 112. The logic unit 112 includes a NOR gate NR2 for receiving an output signal from the NOR gate NR1, together with the test mode signal tpara, and performing a NORing operation for the received signals, and an inverter IV10. The second input signal generator 110 further includes a NAND gate ND3 for receiving an output signal from the logic unit 112, together with the enable control signal ybstendb, generating the second input signal based on the received signals, and outputting the second input signal to the node d.

The first internal auto-precharge signal generator 10 further includes a latching unit 102 which is connected between the first input signal generator 100 and the NAND gate ND2, and includes inverters IV2 and IV3 for latching the first input signal acg_detb, and a delaying unit 104 which is an inverter chain including a plurality of inverters IV4 to IV9 adapted to delay an output signal from the latching unit 102 for a predetermined period. The first internal auto-precharge signal generator 10 further includes a PMOS transistor P2 connected between a terminal coupled to a supply voltage Vperi and the node a, to initialize the potential of the node a in response to a power-up signal pwrup, an initialization signal generator 120 for receiving an initialization control signal pre_apcgpb, which is enabled in response to an enable state of the first internal auto-precharge signal nsft_apcgpb, thereby generating an initialization signal tp_apcg2, and a PMOS transistor P3 connected between the supply voltage terminal and the node a, to initialize the potential of the node a in response to the initialization signal tp_apcg2. The initialization signal generator 120 includes a NAND gate ND4 for receiving the supply voltage Vperi and initialization control signal pre_apcgpb, and performing a NANDing operation for the received signals, an inverter IV11 for buffering an output signal from the NAND gate ND4, an inverter chain 122 including a plurality of inverters IV12 to IV16 adapted to delay the output signal for a predetermined period while inversely buffering an output signal from the inverter IV11, and a NAND gate ND5 for receiving the output signal from the inverter IV11, together with an output signal from the inverter chain 122, and performing a NANDing operation for the received signals.

Figure 2C:
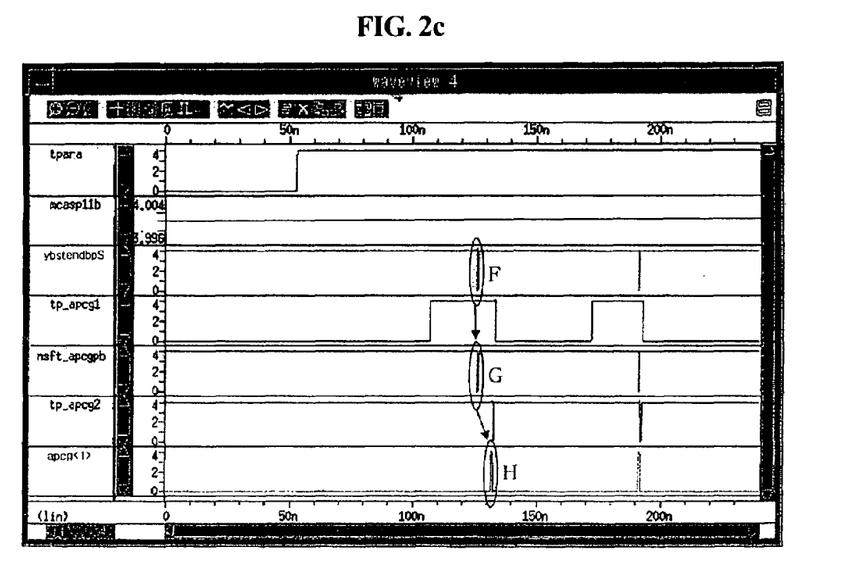
FIG. 2C is a timing diagram illustrating internal signal operations of the circuit shown in FIG. 2B.

Hereinafter, operation of the auto-precharge signal generating circuit having the above-described configuration will be described in detail with reference to FIGS. 2A to 2C. For the simplicity of description, the following description will be given only in conjunction with the first auto-precharge signal generating circuit.

As shown in FIG. 2A, the first internal auto-precharge signal generator 10 generates the first internal auto-precharge signal nsft_apcgpb adapted to auto-precharge the first bank Bank<0> after a read operation for the first bank Bank<0>. Thereafter, the second internal auto-precharge signal generator 12 delays the first internal auto-precharge signal nsft_apcgpb for a predetermined time, and generates the second internal auto-precharge signal sft_apcgpb adapted to auto-precharge the first bank Bank<0> after a write operation for the first bank Bank<0>. The auto-precharge signal selector 14 then determines whether a read operation or a write operation has been carried out in the first bank Bank<0>, and selects one of the first internal auto-precharge signal nsft_apcgpb and second internal auto-precharge signal sft_apcgpb in accordance with the result of the determination. That is, when a read operation has been carried out, the auto-precharge signal selector 14 selects the first internal auto-precharge signal nsft_apcgpb. On the other hand, when a write operation has been carried out, the auto-precharge signal selector 14 selects the second internal auto-precharge signal sft_apcgpb. The auto-precharge signal selector 14 then outputs the selected signal as the auto-precharge signal apcg<0> adapted to auto-precharge the first bank Bank<0>.

In accordance with the present disclosure, the glitch is removed using the test mode signal tpara, to prevent an erroneous auto-precharge operation, in a manner different from the conventional case in which an erroneous auto-precharge operation may be generated. This will be described in detail hereinafter with reference to FIG. 2B.

In accordance with the present disclosure, under the condition in which no test mode is carried out, the node a signal acg_detb is initialized by the power-up signal pwrup. The power-up signal pwrup is a signal transiting to a high level after being maintained at a low level for a predetermined period. Accordingly, when the power-up signal pwrup has a low level, the PMOS transistor P2 is turned on, thereby causing the node a signal acg_detb to be initialized to a high level. the node a signal acg_detb is inversely buffered while passing through the latching unit 102 and delaying unit 104. As a result, the node e signal tp_apcg1 is transited to a low level after a predetermined period. Accordingly, the NAND gate ND2 generates the first internal auto-precharge signal nsft_apcgpb which has a high level, namely, is in a disable state.

Next, when a test mode is carried out in accordance with transition of the test mode signal tpara to a high level, namely, an enable state, each of the first to fourth bank enable signals casp10<0:3> and auto-precharge flag signal a10t8_ap is transited to a high level, namely, an enable state. Accordingly, the node a signal acg_detb is pulled down to a low level. The node e is transited to a high level after a predetermined period. Meanwhile, the NOR gate NR1, to which the second to fourth bank enable signals casp10<1:3> having a high level are input, outputs a low-level signal. However, the logic unit 112 outputs a high-level signal to the node c by virtue of the test mode signal tpara having a high level. The enable control signal ybstendb is high level, when the read or write operation carried out in the first bank Bank<0> in accordance with the execution of the test mode is subsequently incomplete. Thereby, the node d is at a low level, and the first internal auto-precharge signal nsft_apcgpb output from the NAND gate ND2 is maintained a low level, namely a disable state. Thus, in the test mode, the node c is maintained at a low level in accordance with the high-level test mode signal tpara, even though the second to fourth bank enable signals casp10<1:3> have a high level. Accordingly, it is possible to prevent the first internal auto-precharge signal nsft_apcgpb from being enabled by the second to fourth bank enable signals casp10<1:3> having a high level, namely, being in an enable state.

When the read or write operation carried out in the first bank Bank<0> in accordance with the execution of the test mode is subsequently completed, namely, when all data bursts according to the read or write operation are completely output, the enable control signal ybstendb is transited to a low level. As a result, the node d is transited to a high level, thereby causing the first internal auto-precharge signal nsft_apcgpb to transit to a low level, namely, an enable state. Thus, the enabling of the first internal auto-precharge signal nsft_apcgpb is not determined in accordance with the enabling of the second to fourth bank enable signals casp10<1:3>, but is determined only in accordance with the enabling of the enable control signal ybstendb. Accordingly, it is possible to prevent the first bank Bank<0> from being auto-precharged without securing a sufficient time for execution of the read or write operation in the test mode.

As apparent from the above description, the auto-precharge signal generating circuit according to the present disclosure can remove a glitch generated in a test mode, in which an auto-precharge operation is carried out for all banks, using a test mode signal. Accordingly, the auto-precharge operation is carried out after completion of a read or write operation, thereby preventing an erroneous auto-precharge operation.

Although preferred embodiments of the disclosure have been disclosed for illustrative purposes, those skilled in the art will appreciate that various modifications, additions and substitutions are possible, without departing from the scope and spirit of the disclosure and the accompanying claims.

This patent specification is based on and claims priority to Korean patent application No. 10-2006-0059887, filed on Jun. 29, 2006, which is incorporated by reference herein in its entirety.

What is claimed is:

1. An auto-precharge signal generating circuit comprising:
   a first input signal generator configured to generate a first input signal in response to a first bank enable signal and an auto-precharge flag signal, said first bank enable signal being enabled in accordance with a read or write command for a first bank and said auto-precharge flag signal being enabled for auto-precharging of the first bank;
   a second input signal generator configured to receive an enable control signal, a plurality of second bank enable signals, and a test mode signal, and generate a second input signal based on the received signals said enable control signal being enabled after completion of the read or write operation for the first bank, said plurality of second bank enable signals being enabled in response to read commands for a plurality of second banks, respectively, and said test mode signal being enabled for a read with auto-precharge (RDA) operation or a write with auto-precharge (WRA) operation in the first and second banks; and
   an auto-precharge signal output stage configured to receive a buffered signal obtained after buffering of the first input signal, together with the second input signal, generate an auto-precharge signal for auto-precharge of the first bank, and output the auto-precharge signal,
   wherein the second input signal is enabled when the enable control signal is enabled under the condition in which the test mode signal is enabled.

2. The auto-precharge signal generating circuit according to claim 1, wherein the first input signal generator includes first and second terminals connected between the first node and a ground voltage terminal, to output the first input signal to the first node in response to the first bank enable signal and the auto-precharge flag signal.

3. The auto-precharge signal generating circuit according to claim 2, wherein:
the first terminal is connected between the first node and a second node, to transmit a signal at the second node to the first node in response to the first bank enable signal; and
the second terminal is connected to the second node and the ground voltage terminal, to pull down the second node in response to the auto-precharge flag signal.

4. The auto-precharge signal generating circuit according to claim 1, wherein the second input signal generator comprises:
a first logic device configured to receive the plurality of second bank enable signals, and perform a first logical operation of the received second bank enable signals;
a logic unit configured to receive an output signal from the first logic device and the test mode signal, and perform a second logical operation of the received output and test mode signals; and
a second logic device configured to receive an output signal from the logic unit and the enable control signal, and perform a third logical operation of the received output and enable control signals, to generate the second input signal.

5. The auto-precharge signal generating circuit according to claim 4, wherein the first logic device performs a NOR operation of the second bank enable signals.

6. The auto-precharge signal generating circuit according to claim 4, wherein the logic unit performs a NOR operation of the output signal from the first logic device and the test mode signal.

7. The auto-precharge signal generating circuit according to claim 4, wherein the second logic device performs a NAND operation of the output signal from the logic unit and the enable control signal.

8. The auto-precharge signal generating circuit according to claim 1, wherein the auto-precharge signal output stage performs a NAND operation of the buffered signal and the second input signal.

9. The auto-precharge signal generating circuit according to claim 1, further comprising:
a latching unit configured to latch the first input signal; and
a delaying unit configured to delay an output signal from the latching unit for a predetermined period,
wherein the latching unit and the delaying unit are connected between the first input signal generator and the auto-precharge signal output stage.

10. The auto-precharge signal generating circuit according to claim 2, further comprising:
an initializing device connected between a supply voltage terminal and the first node, to initialize a potential of the first node in response to a power-up signal.

11. The auto-precharge signal generating circuit according to claim 2, further comprising:
an initialization signal generator configured to receive an initialization control signal, enabled in response to enabling of the auto-precharge signal, and generate an initialization signal; and
an initializing device connected between a supply voltage terminal and the first node, to initialize a potential of the first node in response to the initialization signal.

12. An auto-precharge signal generating circuit comprising:
a first input signal generator configured to generate a first input signal in response to a first bank enable signal and an auto-precharge flag signal, said first bank enable signal being enabled in accordance with a read or write command for a first bank, and said auto-precharge flag signal being enabled for auto-precharging of the first bank;
a second input signal generator configured to receive an enable control signal, a plurality of second bank enable signals, and a test mode signal, and generate a second input signal based on the received signals said enable control signal being enabled after completion of the read or write operation for the first bank, said plurality of second bank enable signals being enabled in response to read commands for a plurality of second banks, respectively, and said test mode signal being enabled for a read with auto-precharge (RDA) operation or a write with auto-precharge (WRA) operation in the first and second banks;
an auto-precharge signal output stage configured to receive a buffered signal obtained after buffering of the first input signal, together with the second input signal, generate a first internal auto-precharge signal for auto-precharge of the first bank, and output the auto-precharge signal; and
an internal auto-precharge signal generator configured to delay the first internal auto-precharge signal for a predetermined period, and generate a second internal auto-precharge signal adapted to auto-precharge the first bank after the write operation for the first bank,
wherein the second input signal is enabled when the enable control signal is enabled under the condition in which the test mode signal is enabled.

13. The auto-precharge signal generating circuit according to claim 12, wherein the first input signal generator includes first and second terminals connected between the first node and a ground voltage terminal, to output the first input signal to the first node in response to the first bank enable signal and the auto-precharge flag signal.

14. The auto-precharge signal generating circuit according to claim 13, wherein:
the first terminal is connected between the first node and a second node, to transmit a signal at the second node to the first node in response to the first bank enable signal; and
the second terminal is connected to the second node and the ground voltage terminal, to pull down the second node in response to the auto-precharge flag signal.

15. The auto-precharge signal generating circuit according to claim 12, wherein the second input signal generator comprises:
a first logic device configured to receive the plurality of second bank enable signals, and perform a first logical operation of the received second bank enable signals;
a logic unit configured to receive an output signal from the first logic device and the test mode signal, and perform a second logical operation of the received output and test mode signals; and
a second logic device configured to receive an output signal from the logic unit and the enable control signal, and perform a third logical operation of the received output and enable control signals, to generate the second input signal.

16. The auto-precharge signal generating circuit according to claim 15, wherein the first logic device performs a NOR operation of the second bank enable signals.

17. The auto-precharge signal generating circuit according to claim 15, wherein the logic unit performs a NOR operation of the output signal from the first logic device and the test mode signal.

18. The auto-precharge signal generating circuit according to claim 15, wherein the second logic device performs a NAND operation of the output signal from the logic unit and the enable control signal.

19. The auto-precharge signal generating circuit according to claim 12, wherein the auto-precharge signal output stage performs a NAND operation of the buffered signal and the second input signal.

20. The auto-precharge signal generating circuit according to claim 12, further comprising:
   a latching unit configured to latch the first input signal; and
   a delaying unit configured to delay an output signal from the latching unit for a predetermined period,
   wherein the latching unit and the delaying unit are connected between the first input signal generator and the auto-precharge signal output stage.

21. The auto-precharge signal generating circuit according to claim 13, further comprising:
   an initializing device connected between a supply voltage terminal and the first node, to initialize a potential of the first node in response to a power-up signal.

22. The auto-precharge signal generating circuit according to claim 13, further comprising:
   an initialization signal generator configured to receive an initialization control signal, enabled in response to enabling of the auto-precharge signal, and generate an initialization signal; and
   an initializing device connected between a supply voltage terminal and the first node, to initialize a potential of the first node in response to the initialization signal.

* * * * *